United States Patent [19]
Kwong et al.

[11] Patent Number: 4,764,934
[45] Date of Patent: Aug. 16, 1988

[54] SUPERLUMINESCENT DIODE AND SINGLE MODE LASER

[75] Inventors: Sze-Keung Kwong, Long Beach; Kam Y. Lau, Glendale; Nadav Bar-Chaim, South Pasadena; Israel Ury, Los Angeles, all of Calif.

[73] Assignee: Ortel Corporation, Alhambra, Calif.

[21] Appl. No.: 78,367

[22] Filed: Jul. 27, 1987

[51] Int. Cl.$^4$ .............................................. H01S 3/19
[52] U.S. Cl. ...................................... 372/46; 372/50; 372/92; 372/49
[58] Field of Search ....................... 372/46, 50, 92, 49

[56] References Cited

U.S. PATENT DOCUMENTS

| | | | |
|---|---|---|---|
| 4,562,569 | 12/1985 | Yariv et al. | 372/46 |
| 4,563,765 | 1/1986 | Tsano et al. | 372/50 |
| 4,686,679 | 8/1987 | Yano et al. | 372/46 |

OTHER PUBLICATIONS

Ungar, et al., "High-Power GaAlAs Window Lasers", Lasers & Applications, Sep. 1985, pp. 111–114.
Dutta, et al, "Optical Properties of a 1.3—$\mu$m InGaAsP Superluminescent Diode", IEEE Transactions on Electron Devices, vol. ED-30, No. 4, apr. 1983, pp. 360 to 363.
Wang, et al, "High-Power Low-Divergence Superradiance Diode", App. Phys. Lett. vol. 41, (7), Oct. 1, 1982, 1982 American Institute of Physics, pp. 587 to 589.
Tien-Pei Lee, et al, "A Stripe-Geometry Double-Heterostructure Amplified-Spontaneous-Emission (Superluminescent) Diode", IEE Journal of Quantum Electrnics, vol. WE-9, No. 8, Aug. 1973, pp. 820 to 828
Tai, et al, "All-Fibre Gyroscope Using Depolarized Superluminescent Diode"Electronic Letters, 8th May 1986, vol. 22, No. 10, pp. 546, 547.
Niesen, et al, "High Power 0.83 $\mu$m Angle Stripe Superlumiescent Didoe", Three Pages, Paper TUC-2 at the Southwest Optics '87 Conference Sponsored by the Optical Society of America and the Lasers and Electro-Optics Society of IEEE, Feb. 9–12, 1987, Albuquerque, New Mexico.
K. Y. Lau, N. Bar-Chaim, I. Ury, and A. Yariv, "11-GHz Direct Modulation Bandwidth GaAlAs Window Laser on Semi-Insulating Substrate Operating at Room Temperature:, pp. 316–318, Appl. Phys. Lett. 45 (4) Aug. 15, 1984, 1984 American Institute of Physics.

Primary Examiner—Léon Scott, Jr.
Attorney, Agent, or Firm—Christie, Parker & Hale

[57] ABSTRACT

A buried heterostructure window device has an elongated layer of gain medium surrounded by a lower index of refraction medium of guiding light along the length of the gain medium. A window and an antireflective layer are deposited on the output end of the gain layer to minimize reflections. A portion of the gain medium nearer the output end of the device is electrically pumped, leaving an unpumped end of the gain medium remote from the output end. The unpumped portion of the gain medium absorbs light travelling along the length of the gain medium. This inhibits reflection from the end of the gain medium remote from the output end. When the device is pumped with a moderate power level, strong superluminescent output is obtained. When the device is pumped well above the lasing threshold by reason of "burning through" the unpumped absorbing portion of the gain medium, a singe mode laser is obtained with side band power at least 20 db below the power of the principal oscillation mode. "Burning through" the unpumped absorbing portion can be inhibited by extracting current carriers from that portion of the medium.

25 Claims, 2 Drawing Sheets

SUPERLUMINESCENT DIODE AND SINGLE MODE LASER

The government of the United States of America has rights in this invention pursuant to Contract No. N00014-586-C-2477 awarded by the Naval Research Laboratory, U.S. Department of Defense.

BACKGROUND

Superluminescent or superradiant semiconductor diodes have a number of uses including fiber gyroscopes, and optical communications. Superluminescent diodes are characterized by very much higher power output than light emitting diodes, and by broad band radiation as compared with the narrow spectral frequencies of lasers. An exemplary superluminescent diode is essentially a one pass "laser" which emits at a large number of frequencies, rather than oscillating at certain preferred frequency modes.

It is desirable that a superluminescent diode (SLD) produce an output beam with low divergence and which can be easily coupled to an optical fiber. It is desirable to have high power output in either pulsed or CW modes of operation. For some applications it is desirable to have a high power SLD with wavelengths in the neigborhood of 0.7 to 0.9 microns as compared with the 1.3 to 1.5 micron wavelength ranges of the indium gallium arsenide phosphide family of semiconductors.

In the course of seeking a high power SLD in practice of this invention, it has been discovered that a much improved single mode, short wavelength, semiconductor laser can be provided. It is desirable to provide such a single mode laser where the side bands are largely suppressed.

BRIEF SUMMARY OF THE INVENTION

There is, therefore, provided in practice of this invention according to a presently preferred embodiment, a structure that can operate as a high power superluminescent diode, or with increased pumping current, as a highly single mode semiconductor laser. A buried heterostructure window device has an elongated active gain layer sandwiched between cladding layers for pumping the gain layer. Layers having a lower index of refraction than the active layer are formed along each longitudinal edge of the active gain layer for minimizing angular dispersion of the output light beam. A transparent window at the output end of the active gain layer prevents catastrophic optical damage at the end of the active layer. An antireflective coating on the window minimizes feedback to the active gain layer. A light absorbing medium at the end of the active gain layer away from the window absorbs radiation propagating away from the output end, thereby suppressing laser oscillation. When sufficient pumping current is applied to such a structure, if no current is extracted from the absorbing region, the absorbing layer is "burned through," that is, rendered transparent, which leads to lasing oscillations occurring in a single mode with very low power side modes. On the other hand, if charge carriers are extracted from the absorbing region, for example through a connection to ground, lasing will be further suppressed and additional low coherence optical output is obtained.

BRIEF DESCRIPTION OF THE DRAWINGS

These and other features and advantages of the present invention will be appreciated as the same becomes better understood by reference to the following detailed description when considered in connection with the accompanying drawings wherein.

DESCRIPTION

Figure 1:
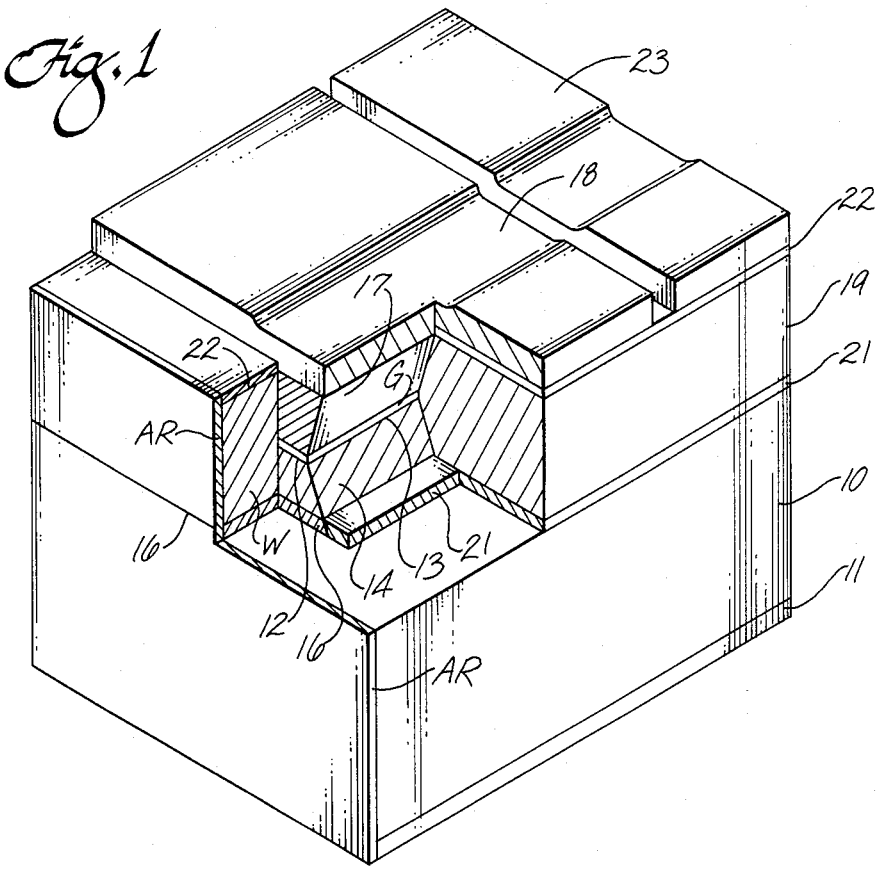
FIG. 1 is a schematic isometric drawing of the structure of a superluminescent diode partially cut away to show its internal structure.

The drawing in FIG. 1 illustrates the functional features of a superluminescent diode (SLD) and their general geometric relations with each other to perform their respective functions. The relative dimensions of the features are neither indicated nor of appreciable significance except for a few numerical values listed hereinafter. Thus, no reliance should be placed on scaling the drawings in this application. The dimensions not set forth in this specification may be whatever is convenient or conventional for manufacture of the device.

The device is fabricated on a substrate 10 of n+-GaAs. At the bottom of the substrate there is a metallic layer 11 such as AuGe-NiAu which provides an area to make an n-contact with the device. As used in this description, top, bottom, up, down, and the like may be used for convenience in referring to the drawings as an aid to understanding. It will be appreciated by those skilled in the art that such a device may be mounted up-side-up or up-side-down as may be preferred for providing a heat sink, electrical contacts and the like.

Light from the device is emitted from an active gain layer G, which in a preferred embodiment is formed of the active semiconductor $Ga_{1-y}Al_yAs$. In an exemplary embodiment y in the formula for $Ga_{1-y}Al_yAs$ is 0.06. The gain layer is typically 0.1 micron thick, 1 micron wide and may be 200 microns or more in length. In the cutaway drawing of FIG. 1, the output end 12 and one side edge 13 of the active gain layer G can be seen. A lower cladding layer 14 of $n-Ga_{1-x}Al_xAs$ extends between a raised pad 16 on the substrate and the lower face of the active gain layer.

An upper cladding layer 17 of $p-Ga_{1-x}Al_xAs$ overlies the upper face of the active gain layer. A metallic strip 18 such as Cr-Au extends across the top of the device, including at least a portion overlying the active gain layer. This provide a p-contact for the device. Electrical leads (not shown) as appropriate, may be connected to the n- and p-contacts or these may be contacted electrically by clamping, soldering to a substrate, or other conventional means. For reasons that will appear hereafter, the metal strip 18 and/or the upper cladding layer 17, do not extend the full length of the strip of GaAlAs forming the active gain layer. Thus, as seen in FIG. 1 the metallic strip overlies only a midportion of the device.

A separate metallic strip 23 overlies the rear portion of the active layer and is electrically isolated from the metallic strip overlying the mid portion of the device. An electrical lead (not shown) is connected to the second metallic strip. This provides electrical contact with the portion of the gain layer remote from the window.

A relatively thick current blocking layer 19 of n-$Ga_{1-x}Al_xAs$ extends along each side edge of the active gain layer. A thinner current blocking layer 21 of p-$Ga_{1-x}Al_xAs$ lies between the n-type current blocking layer 19 and the substrate on each side of the raised pad 16 on the substrate. The current blocking layers 19 and 21 form a reverse bias junction that prevents current flow. In addition, a layer of silicon dioxide 22 overlies the n-type current blocking layer as electrical insulation. The current blocking layers along each side edge of the active gain layer have a higher aluminum content than the active gain layer and therefore a lower index of refraction. In an exemplary embodiment x in the formula for $Ga_{1-x}Al_xAs$ is 0.38. As will be apparent by analogy to a buried heterostructure laser, this results in transverse confinement of light traveling along the active gain layer.

Between the output end 12 of the gain layer and the front or output face of the device, there is a window W comprising $Ga_{1-x}Al_xAs$. The absorption coefficient of this material is smaller than that of unpumped active layer GaAlAs by several orders of magnitude, and can therefore be considered for all practical purposes to be transparent. Such a window structure is described in a diode laser in "11-GHz Direct Modulation Bandwidth GaAlAs Window Laser on Semi-insulating Substrate Operating at Room Temperature" by Kam Lau, Nadav Bar-Chaim, and Israel Ury, *Appl. Phys. Ltrs.*, 45, (4), Aug. 15, 1984. The bandgap of the material in the window is sufficiently large that no optical absorption occurs there, and catastrophic optical damage does not occur.

A conventional quarter wave antireflective coating, AR, is deposited across the face of the window to minimize reflectivity from the front or output face of the device.

Figure 2:
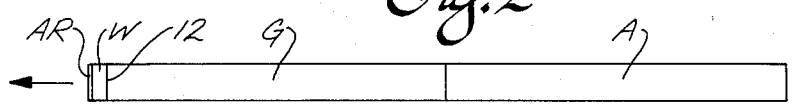
FIG. 2 is a schematic illustration of the features along the optical path through such a superluminescent diode.

FIG. 2 illustrates quite schematically the optical path in an exemplary SLD such as that illustrated schematically in FIG. 1. As has been described, the device has an active gain layer G with a window W, and an antireflective coating AR at its front or output end. The gain medium is pumped with electric current by the n- and p-type cladding layers 14 and 17 (FIG. 1). When so pumped, emission of light is stimulated in the active gain layer. An absorber layer A is at the back or non-output end of the active gain layer. When the material forming the gain layer is not pumped, it is highly absorbing of the characteristic radiation emitted. It is therefore an easy matter to provide an absorbing layer A by not pumping the back portion of the gain layer. Thus, referring to the schematic illustration of FIG. 1, the layer of $Ga_{1-y}Al_yAs$ extends from the output face 12 of the active gain layer to the back face (hidden) of the device. That portion of the GaAlAs layer under the metallic strip 18 is pumped by the upper and lower cladding layers, and when pumped, acts as an optical amplifier. The portion of the GaAlAs between the edge of the metallic strip and the back face of the device is not pumped and therefore forms a good absorber. A metallic contact stripe covering less than the full length of a gain medium provides absorption in a gain guided, four layer, double-heterostructure SLD in "A Stripe-Geometry Double-Heterstructure Amplified-Spontaneous-Emission(Superluminescent) Diode," by Tien-Pei Lee, Charles A. Burrus, Jr., and B. I. Miller, "IEEE Journal of Quantum Electronics," *OE*-9 (August, 1973) 820–828.

When current is applied to the metallic contact 18, the active gain layer is pumped and there is spontaneous emission of light in essentially all directions. The nearness of the index of refraction of the surrounding material to the index of refraction of the gain layer in the buried heterostructure SLD effectively confines only radiation travelling nearly longitudinally in the active gain layer. Radiation in other directions is lost from the gain medium and not amplified. Radiation traveling toward the back or non-output end of the gain layer passes into the absorber A, from which little light is reflected. Light travelling toward the output end of the active gain layer is amplified in transit and then passes through the window W and antireflective layer AR as a strong output beam.

In an exemplary embodiment, the length of the gain layer is in the range of from 250 to 450 microns. Similarly, the length of the absorber at the non-output end of the gain region is in the range of from 200 to 450 microns. The optimum proportions of the gain and absorber regions is not yet determined. For example, SLDs have been operated with a gain length of 250 microns and absorber layers having lengths of 200 to 450 microns. An SLD has been shown to operate satisfactorily with a length of 450 microns for the active gain layer and a length of 200 microns for the absorber layer.

There are somewhat contradictory desiderata for the length of the window at the output end of the active gain layer. It is desirable to have a short window in an SLD to enhance the ability to couple the output light beam to an optical fiber. On the other hand, it is desirable to have a long window in an SLD to minimize reflection from the output face of the device. It is generally desirable for a laser to have a short front window to minimize light losses. At present it is believed that the length of the front window should be in the range of from one to ten microns.

Figure 6:
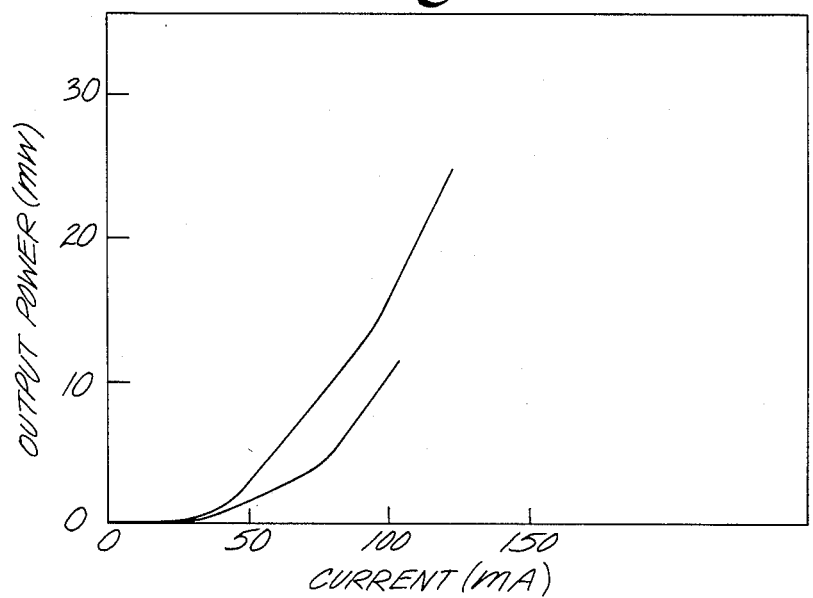
FIG. 6 is a graph of output power as a function of applied current in one embodiment of superluminescent diode.

FIG. 6 illustrates the output power in the light beam from an exemplary SLD as a function of pumping current, and shows the significant benefits of applying an antireflective coating at the output end of the device. Each of the two curves illustrated indicates the light output from the device operated in a continuous wave mode mounted up-side-up on a copper heat sink. The lower curve in FIG. 6 is the output from a device without an antireflective coating on the front. The upper curve is a similar device with a less than optimum antireflective coating, in that it still retains reflectivity in the order of 3 to 4%. Even so, there is a significant increase in power output.

Figure 7:
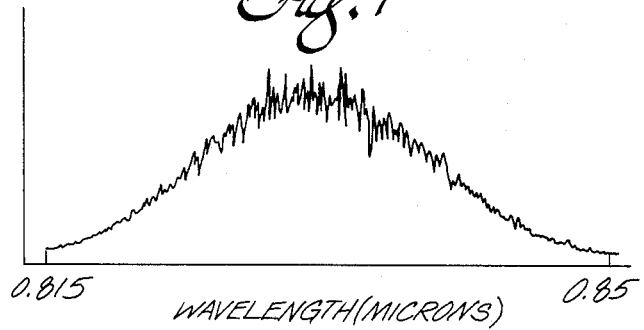
FIG. 7 is a graph indicating the approximate power distribution as a function of wavelength in one embodiment of superluminescent diode.

Each of the curves shows a "threshold" or "knee." The first knee is interpreted as the beginning of the superluminescent mode of operation. FIG. 7 represents (approximately) the emission spectrum in an output beam from a device with an antireflective coating operating at a current level approximately midway between the two knees on the upper curve (75 mA). This is a near ideal superluminescent spectrum with almost no observable modulation.

When there is no antireflective coating on the window, above the second threshold, distinct longitudinal modes emerge at the longer wavelength end of the superluminescent spectrum. It is observed that this coincides with an increase in optical power from the back face of the device where the absorber is located. This is interpreted as "burning through" of the absorber by the superluminescent emission.

The burn through of the absorber in the SLD is due to self-pumping of the material in the absorber, which sufficiently populates the conduction and valence bands with electrons and holes, respectively, to render the medium transparent. Reflection from the back face results in distinct longitudinal lasing modes. The reason that the lasing modes commence at the longer wavelength end of the spectrum is believed to be due to the lower absorption at photon energies closer to the band gap.

As can be seen from FIG. 6, the addition of an antireflective coating on the front face has significantly increased the power required to burn through the rear absorber since less light is reflected back along the gain medium and amplified enroute. The second threshold has been increased from about 3.5 mW to about 15 mW. Both of these curves were obtained using a device with an active gain layer 250 microns long and an absorber 200 microns long. The reflectivity of each face when uncoated is estimated at about 30%. The AR coated end is believed to have a reflectivity of less than 4%. An antireflective coating with lower reflectivity than in these experiments would increase output power from the front face, and minimize reflective power which contributes to burn through of the absorber.

A strategy for suppressing burn through of the absorber is to extract current carriers generated by absorption of light. The accumulation of holes and electrons due to absorption of radiation eventually makes the absorber transparent and the superluminescent diode may commence to lase. To avoid this, the current carriers are extracted. The conductive layer 23 on the device over the absorber portion provides electrical contact to either extract or inject current as required to depopulate the current carriers generated by absorption of light. This suppresses lasing and higher optical output of low coherence optical radiation can be obtained.

Figure 3:
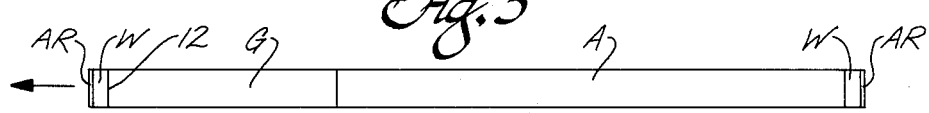
FIG. 3 is a schematic illustration similar to FIG. 2 of another embodiment of superluminescent diode.

FIG. 3 illustrates schematically a strategy for further increasing output power before substantial longitudinal modes of lasing are significant, i.e., raising the power level of the output beam before the second knee occurs in an output curve of the type illustrated in FIG. 6. In the embodiment of FIG. 3, the relative length of absorber region A to the gain region G is increased so that there is greater absorption of light at the back of the active gain layer before population of the full length of the absorber occurs. A window W and an antireflective coating AR are provided on the front face of the active gain layer as hereinabove described. Further, a window W and antireflective coating AR are provided at the back face of the absorber layer. This permits a greater proportion of the light to escape from the back face of the device to suppress lasing, even when the absorber is partially burned through.

Figure 4:
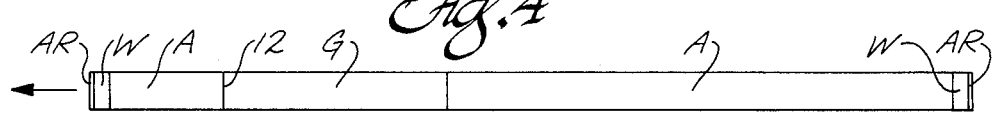
FIG. 4 is a schematic illustration along the optical path of another embodiment of superluminescent diode.

FIG. 4 illustrates schematically another embodiment of SLD with enhanced output power. In this embodiment, there is an active gain layer G and an absorber A at the back of the gain layer as hereinabove described. A window W and an antireflective layer AR are provided at each end of the SLD. In addition, a short absorber layer A is provided at the output end 12 of the gain layer. This second output absorber retains some absorption even when self-pumped and burned through. This residual absorption does tend to decrease power output, but it is believed that this is more than compensated by absorption of light reflected from the antireflective coating and light reflected back into the SLD from external optical elements. The reduction of internal and external reflections by this front absorber further suppresses longitudinal oscillation modes in the SLD cavity.

No excessive heating of the absorbers has been observed in these devices. The difference between contituous wave and pulse operation is minor and typical of any lasing devices. Thus, the SLD output power seems to be limited only by absorber burn through rather than current or optical heating.

The optimum length of the front absorber in this embodiment is not yet known, but it appears to be in the range from 10 to 100 microns. High SLD output has been obtained with devices having an active gain layer length of 250 microns and a back absorber length of 400 microns, with front absorber lengths of 10 and 100 microns respectively.

Figure 8:
FIG. 8 is a graph of power as a function of wavelength when such a device is operated as a single mode laser.

Surprisingly, it has been found that when pumping current is increased sufficiently in an SLD device as provided in practice of this invention, it converts to a highly single mode laser. An exemplary spectrum of such a laser is illustrated in FIG. 8. A single longitudinal mode of oscillation with high output power is produced, with side modes at least 20 db less than the principal frequency. This amount of side mode suppression is comparable to that observed in the best known lasers of GaAlAs. The enhanced suppression of side modes is clearly of appreciable significance.

The reason for suppression of the side modes or augmentation of the principal mode is not completely clear as yet. It appears that the rear absorber, that is the absorbing layer at the non-output end of the active gain layer, is the principal influencing factor. Some property of the population inversion due to self-pumping instead of the usual pumping in a laser cavity is probably causing this effect.

The highly single mode nature of the device operated as a laser is also believed to critically depend on the buried heterostructure nature of the device. The index of refraction guided longitudinal oscillation in the laser cavity tends to promote a single longitudinal mode with greater effectiveness than a gain guided device. The buried heterostructure with index guiding provides an excellent waveguide for the light and the sharp boundaries between the higher index active gain region and lower index blocking layers may enhance side mode suppression better than a gain guided laser.

The narrow pumped gain layer with low index of refraction sidewalls tends to promote a single lobe farfield pattern to very high power levels. A buried heterostructure laser may show several longitudinal modes at low power but becomes predominantly single longitudinal mode at higher power.

Figure 5:
FIG. 5 is a schematic illustration along the optical path through such a structure particularly suitable for use as a single mode laser.

FIG. 5 illustrates schematically an embodiment modified to enhance the power output of the device operating as a single mode laser. In this embodiment there is an active gain layer G with a window W. An absorber region A is provided at the non-output end of the active gain layer. At the opposite end of the absorber, a high reflectivity mirror coating M is applied for promoting reflection through the laser cavity. Thus, when the absorber burns through, a greater proportion of the light is retained in the cavity for amplification.

A technique has also been devised for decreasing the reflectivity of the antireflective coating on the front of the device. This uses in situ monitoring of the laser output while it is being coated. The laser is mounted on a jig inside a vacuum coating chamber and is connected to a current source for pumping during deposition of the coating material. The optical output of the laser is coupled to an optical fiber bundle which conveys light through a vacuum seal to the exterior of the chamber where the light can be monitored.

In one mode of operation the device is operated below the lasing threshold, and the power output from the optical fiber is monitored to provide a direct measure of the effectiveness of the antireflective coating. Coating is discontinued when output power peaks. Preferably, the emission spectrum of the laser is scanned during deposition so that the coating process can be discontinued when the desired spectral properties are obtained. With such a technique, a reflectivity estimated to be as low as $10^{-4}$ may be obtained from an antireflective coating on a laser or SLD cavity.

Although a few embodiments of superluminescent diode or highly single mode semiconductor laser have been described and illustrated herein, many modifications and variations will be apparent to one skilled in the art. Thus, for example, although the preferred material for the buried heterostructure device is gallium aluminum arsenide because of its emittance in the near infrared, it will be apparent that other semiconductors may be employed for obtaining light in other wavelength ranges. For example, InGaAsP or the like may also be used.

Instead of an anti-reflective coating and/or window on the end of absorbing medium remote from the active gain layer, other means may be used for minimizing reflections, thereby raising the threshold at which lasing activity becomes significant. For example, the wave guide like structure of the absorbing medium between low index refraction layers may be misaligned with the back face of the device. With such an arrangement, radiation reaching the back face is largely transmitted out of the device or reflected into the surrounding blocking medium rather than being reflected back along the length of the gain medium. Such an arrangement in an SLD is described by J. Niesen, P. H. Payton, C. B. Morrison and L. M. Zinkiewicz in "High Power 0.83 μm Angle Stripe Superluminescent Diode," Paper TUG-2 at the Southwest Optics '87 Conference sponsored by the Optical Society of America and the Lasers and Electro-optics Society of IEEE, Feb. 9–12, 1987, Albuquerque, N.M.

A variety of specific structural arrangements and accouterments for coupling the output light to an optical fiber may also be employed. It is, therefore, to be understood that, within the scope of the appended claims, this invention may be practiced otherwise than as specifically described.

What is claimed is:

1. A buried heterostructure superluminescent diode comprising:
   an elongated active gain layer having an output end and a non-output end;
   a first n-type cladding layer on one face of the gain layer and a second p-type cladding layer on the other face of the gain layer for pumping the active gain layer, the cladding layer having a lower index of refraction than the active gain layer;
   a blocking layer having a lower index of refraction than the active gain layer along each longiudinal edge of the active gain layer;
   a transparent window at the output end of the active gain layer;
   an antireflective coating on the window layer; and
   a light absorbing medium at the non-output end of the active gain layer.

2. A superluminescent diode as recited in claim 1 further comprising a second transparent window at the opposite end of the absorbing medium from the end of the active gain layer.

3. A superluminescent diode as recited in claim 2 further comprising an antireflective coating on the second transparent window.

4. A superluminescent diode as recited in claim 1 further comprising a second antireflective coating at the opposite end of the absorbing medium from the active gain layer.

5. A superluminescent diode as recited in claim 1 further comprising a second light absorbing medium between the active gain layer and the transparent window.

6. A superluminescent diode as recited in claim 1 further comprising a reflective mirror at the opposite end of the light absorbing medium from the active gain layer.

7. A superluminescent diode as recited in claim 1 wherein the active gain layer comprises GaAlAs.

8. A superluminescent diode as recited in claim 7 wherein the absorbing medium comprises GaAlAs.

9. A superluminescent diode as recited in claim 1 wherein the absorbing medium comprises unpumped material the same as the active gain layer.

10. A superluminescent diode as recited in claim 1 further comprising means for extracting current carriers from the absorbing medium.

11. A buried heterostructure superluminescent diode comprising:
    an elongated layer of gain medium having an output end and a non-output end;
    means for pumping only a portion of the gain medium nearer the output end for stimulating emission of radiation in the pumped portion and leaving the balance of the gain medium as a light absorbing medium;
    a medium along each side edge of the gain medium having a lower index of refraction than the gain medium for guiding light therein;
    a transparent window at the output end of the gain medium; and
    an antireflective coating on the window.

12. A superluminescent diode as recited in claim 11 wherein the gain medium comprises GaAlAs.

13. A superluminescent diode as recited in claim 11 further comprising a second window at the end of the unpumped portion of the gain medium remote from the pumped gain medium.

14. A superluminescent diode as recited in claim 13 further comprising a second antireflective coating on the second window.

15. A superluminescent diode as recited in claim 11 further comprising a second antireflective coating at the end of the unpumped portion of the gain medium remote from the pumped portion of the gain medium.

16. A superluminescent diode as recited in claim 11 further including a second unpumped portion of the gain medium between the pumped portion and the window, the second unpumped portion being shorter than the first mentioned unpumped portion.

17. A superluminescent diode as recited in claim 11 further comprising a reflective mirror at the end of the unpumped portion of the gain medium remote from the pumped portion of the gain medium for operation of the superluminescent diode as a single mode laser when the light absorbing medium becomes transparent.

18. A superluminescent diode as recited in claim 11 further comprising means for extracting current carriers from the unpumped portion of the gain medium.

19. A single mode semiconductor buried heterostructure laser comprising:
an elongated active gain layer having an output end and a non-output end;
a first n-type cladding layer on one face of the gain layer and a second p-type cladding layer on the other face of the gain layer for pumping the active gain layer, the cladding layer having a lower index of refraction than the active gain layer;
a blocking layer having a lower index of refraction than the active gain layer along each longitudinal edge of the active gain layer;
a transparent window at the output end of the active gain layer; and characterized by
a light absorbing medium at the non-output end of the active gain layer for suppressing side mode oscillation.

20. A superluminescent diode as recited in claim 19 further comprising a reflective mirror at the opposite end of the light absorbing medium from the active gain layer.

21. A method for decreasing side band power in a buried heterostructure semiconductor laser comprising:
pumping an active gain medium in the laser cavity with sufficient power to stimulate lasing and
absorbing a portion of the light traveling along the length of the laser cavity with unpumped inactive gain medium between the ends of the cavity.

22. A method as recited in claim 21 comprising absorbing light in unpumped gain medium at one end of the pump gain medium and emitting from the laser from the opposite end of the pumped gain medium.

23. A method as recited in Claim 21 comprising absorbing a portion of the light with unpumped gain medium at each end of the pumped gain medium.

24. A method for controlling deposition of an anti-reflective coating on a laser comprising:
pumping the laser to stimulate emission of radiation;
depositing a material to form an anti-reflective coating on an end of the laser;
monitoring light output from the laser during deposition; and
discontinuing deposition when the laser light reaches a desired power magnitude.

25. A mehod for controlling deposition of an anti-refelective coating on a laser comprising: pumping the laser to stimulate emission of radiation; deposition a material to form an anti-reflective coaing on an end of the laser; monitoring light output from the laser during deposition; and discontinuing deposition when the laser light reaches a desired spectral distribution.

* * * * *